(12) United States Patent
Hurley

(10) Patent No.: US 6,387,777 B1
(45) Date of Patent: May 14, 2002

(54) VARIABLE TEMPERATURE LOCOS PROCESS

(76) Inventor: Kelly T. Hurley, 3392 S. Ashbury Pl., Boise, ID (US) 83706

( * ) Notice: Subject to any disclaimer, the term of this patent is extended or adjusted under 35 U.S.C. 154(b) by 0 days.

(21) Appl. No.: 09/145,107

(22) Filed: Sep. 2, 1998

(51) Int. Cl.$^7$ .............................................. H01L 21/76
(52) U.S. Cl. ...................... 438/439; 438/770; 438/404; 437/69; 437/70
(58) Field of Search ................................ 438/439, 404, 438/770, 773; 437/239, 69, 70

(56) References Cited

U.S. PATENT DOCUMENTS

| | | | |
|---|---|---|---|
| 3,650,042 A | * 3/1972 | Berger et al. | 34/148 |
| 4,016,017 A | 4/1977 | Aboaf et al. | 148/187 |
| 4,109,030 A | 8/1978 | Briska et al. | 427/93 |
| 4,179,792 A | 12/1979 | Marshall et al. | 29/571 |
| 4,551,910 A | 11/1985 | Patterson | 29/576 |
| 4,630,356 A | 12/1986 | Christie et al. | 29/576 W |
| 5,087,586 A | 2/1992 | Chan et al. | 437/72 |
| 5,338,750 A | 8/1994 | Tuan et al. | 437/70 |
| 5,358,894 A | 10/1994 | Fazan et al. | 437/70 |
| 5,468,675 A | 11/1995 | Kaigawa | 437/69 |
| 5,478,400 A | * 12/1995 | Shimizu | 118/733 |
| 5,610,104 A | * 3/1997 | Mitchell | 437/228 |
| 5,637,528 A | * 6/1997 | Higashitani et al. | 438/452 |
| 5,686,346 A | * 11/1997 | Duane | 437/69 |
| 5,756,390 A | 5/1998 | Juengling et al. | 438/439 |
| 5,817,581 A | * 10/1998 | Bayer et al. | 438/770 |
| 5,840,368 A | * 11/1998 | Ohmi | 427/255.4 |
| 5,923,994 A | * 7/1999 | Motoyama | 438/439 |
| 5,935,650 A | * 8/1999 | Lerch et al. | 427/255.4 |

FOREIGN PATENT DOCUMENTS

| | | |
|---|---|---|
| JP | 0148389 | 12/1978 |
| JP | 60-167349 | 8/1985 |
| JP | 2-219253 | 8/1990 |
| JP | 2-260639 | 10/1990 |
| JP | 3-266435 | 11/1991 |
| JP | 4-72729 | 3/1992 |
| JP | 4-130630 | 5/1992 |
| JP | 4-162528 | 6/1992 |

OTHER PUBLICATIONS

J.W. Lutze et al., "Field Oxide Thinning in Poly Buffer LOCOS Isolation with Active Area Spacings to 0.1 $\mu$m" J. Electrochemical Society, Jun. 1990, pp 1867–1870.

Marshall et al., "Dry Pressure Local Oxidation of Silicon for IC Isolation". J. of the Electrochemical Society, Oct. 1975, vol. 122, No. 19, pp. 1411–1412.

S. Wolfe, "Silicon Processing For the VLSI Era" Oxidation, Lattice Press, Sunset Beach, CA, vol. 1, , pp. 216–218 (1986).

S. Wolf, "Silicon Processing for the VLSI Era", vol. II, pp. LOCOS 23–33; pp. 237;239 (1990).

S. Wolf, "Silicon Processing for the VLSI Era", vol. III, pp. 330–344; 362–367 (1994).

S. Sze, "VLSI Technology"—Oxidation, 2d Ed. McGraw Hill, NY pp. 121–123.

* cited by examiner

Primary Examiner—Matthew Smith
Assistant Examiner—Renzo N. Rocchegiani
(74) Attorney, Agent, or Firm—Knobbe, Martens, Olson & Bear, LLP.

(57) ABSTRACT

A process of forming isolation structures in semiconductor substrates comprises exposing a selected region of the substrate to an oxidizing ambient held at a first predetermined temperature. As the temperature of the oxidizing ambient is ramped up towards a second predetermined temperature, a relative equilibrium state between oxidation rate and the oxide viscosity is maintained. The process of the present embodiment advantageously is maintained through, the remainder of the equilibrium state oxidation process, so that an isolation layer can be grown without exerting defect-inducing stress over the silicon substrate.

26 Claims, 2 Drawing Sheets

VARIABLE TEMPERATURE LOCOS PROCESS

BACKGROUND OF THE INVENTION

1. Field of the Invention

The present invention generally relates to semiconductor integrated device design and fabrication and, more particularly, to techniques for growing field oxide isolation layers in semiconductor substrates.

2. Description of the Related Art

In Metal-Oxide-Semiconductor (MOS) integration technology, the continuing trend in Ultra Large Scale Integration (ULSI) is driving the semiconductor industry to explore new materials and processes for fabricating integrated devices having sub-half-micron sized features.

This is of particular relevance to the manufacture of DRAM memory devices. Specifically, as the dimensions of individual memory cells in a DRAM array continue to shrink, the need for efficient and reliable isolation processes to separate active device regions dramatically increases. Consequently, radical modifications in conventional isolation technology are needed to isolate the devices of future scaled down integrated circuits.

Currently, LOCOS (for LOCal Oxidation of Silicon) process is widely used for device isolation applications in the semiconductor industry. In general, a thin layer of silicon oxide ($SiO_2$) is initially grown over the wafer surface. This thin oxide layer is often referred to as pad oxide and functions for inhibiting the transition of stresses between the silicon substrate and the subsequently deposited nitride layer. Following this, a layer of silicon nitride is deposited on top of the pad oxide layer and lithographically defined to form an oxidation mask over the active device regions of the wafer. The nitride layer prevents the oxidation of active areas during the isolation oxide growth. The nitride layer is etched from the area between the active areas where an isolating $SiO_2$ layer, which is known as field oxide, is to be thermally grown over the wafer. In a LOCOS process, the oxidation is performed in an oxidation furnace at a temperature range between 800° C. and 1100° C. At this temperature range, wafers are exposed to oxidizing species, such as oxygen or water steam, to grow the field oxides.

Unfortunately, there are problems associated with growing these field oxide regions with the conventional LOCOS process. These problems basically originate from both the volumetric expansion and the kinetic of the oxidation reaction. During the oxidation reaction each unit volume of silicon produces two units of silicon oxide. This two-fold expansion causes a high level of stress build-up, especially at the silicon-silicon dioxide ($Si/SiO_2$) interface under the edge of the nitride masking layer and in the substrate regions near this interface.

The kinetics of the oxidation reaction also intensifies this problem during the course of the oxidation process. During the course of oxidation, the silicon dioxide experiences both the linear and logarithmic growth rates. At the beginning of the oxidation, the oxidation rate is linear, i.e., the oxide layer grows uniformly with respect to increasing oxidation time. At this stage, the oxide layer is thin so that the oxidizing species easily diffuse to the silicon-silicon oxide interface through the thin but growing oxide layer, causing further growth at the interface. However, as the oxide layer becomes thicker, the diffusion of oxidizing species across this oxide layer becomes more difficult. Under these conditions, the oxidation shifts from a linear to a logarithmic rate, which results in a slower oxidation rate.

Stress-related problems are most severe during early linear growth in the LOCOS process. At this beginning stage, the stress caused by rapid volumetric expansion of the silicon oxide layer introduces many defects into the silicon substrate. These defects deteriorate the quality of device isolation, causing current leakage between neighboring devices, and resulting in device failures. Therefore, any technique aimed at reducing this unwanted stress in the substrate greatly increases final device reliability and quality.

One method of reducing stress-induced defects is by performing the oxidation at an elevated temperature, generally as high as 1100° C. Specifically, high temperature oxidation greatly reduces the viscosity of the growing oxide layer. In this less viscous state, the growing oxide layer flows easily from the $Si/SiO_2$ interface under the edge of the nitride masking layer, thereby effectively relieving the defect forming stresses at the neighboring substrate regions.

Although the process reduces the stress level in the substrate by flowing the oxide layer from under the edge of the nitride masking layer, high temperature oxidation has significant drawbacks. For example, while decreasing viscosity in the field oxide, high temperature oxidation even further increases the rate of oxidation during linear growth. At this high temperature, the oxide growth rate can be so high that the oxide layer may grow faster than it flows. As a result, the growing oxide layer still exerts stress on the substrate and cause defects.

Another drawback is active area loss induced by the lateral encroachment of the growing field oxide, which is often referred to as "bird's beak" encroachment. In fact, the bird's beak problem is one of the most serious problems encountered in the conventional LOCOS process, greatly reducing the efficiency of conventional LOCOS processes. The bird's beak encroachment causes the field oxide layer to grow under and lift the edges of the nitride masking stack during field oxide growth. Therefore, bird's beak encroachment reduces the size of the usable active areas on the substrate by transforming them into silicon oxide.

SUMMARY OF THE INVENTION

Accordingly, there is a need in current semiconductor technology for improved methods of forming isolation regions without losing active areas. Additionally, a need exists to minimize the stress during the oxidation processes.

The aforementioned needs are satisfied by the process of the present invention, which provides field oxide in isolation regions without exerting significant stress in the substrate under the edge of the nitride masking layer. In the illustrated embodiment, a wet oxidation process can begin at temperatures below conventional oxidation temperatures, while the substrate temperature is being ramped up towards a higher temperature.

Specifically, the lower starting temperature in the illustrated embodiment provides a lower oxidation rate during the ramp, and thus retards the initial growth and resulting volumetric expansion. This, in turn, provides sufficient time to grow enough oxide such that the oxidation rate is in the logarithmic regime at each temperature during the ramp up. Therefore, at this lower temperature, a relative equilibrium is established wherein the oxidation rate remains less than or equal to the oxide flow rate. Desirably, such a relative equilibrium is maintained throughout the oxidation process.

In one aspect of the present invention, therefore, a process of forming an isolation region in a semiconductor substrate includes providing the substrate with a defined isolation region. The substrate is positioned in a reaction chamber and the substrate is heated from a from a first temperature to a second temperature. While the substrate is being heated, the isolation region is exposed to an oxidizing ambient. Accordingly, an oxide is grown in the isolation region while heating the substrate.

Since the plateau or steady temperature has not yet been reached, this oxide growth is slower than initial oxide growths in conventional chambers, even if a wet oxidation is used. Moreover, in the illustrated embodiment, wet oxidation during temperature ramping is preceded by an initial dry oxidation, further slowing the starting wet oxidation since the wet oxidants must diffuse through the intitial oxide.

BRIEF DESCRIPTION OF THE DRAWINGS

These and other aspects will become more fully apparent from the following description, taken in conjunction with the accompanying drawings, which are meant to illustrate and not to limit the invention, wherein.

DETAILED DESCRIPTION OF THE PREFERRED EMBODIMENT

Figure 1A:
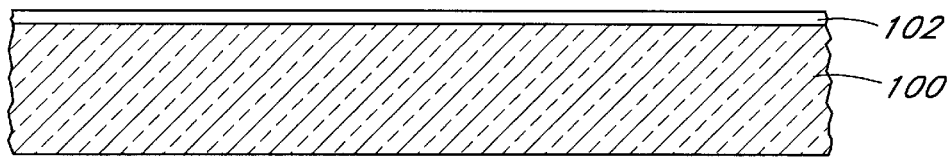
FIG. 1A is a partial cross-sectional view of a semiconductor substrate having a pad oxide layer grown on the top side.

Reference will now be made to the drawings wherein like numerals refer to like parts throughout. FIG. 1A illustrates that a pad oxide layer 102 is initially grown on a semiconductor substrate 100. In the illustrated embodiment, the substrate 100 comprises a monocrystalline silicon wafer. It will be understood by one of skill in the art of semiconductor processing, however, that the "substrate" in other arrangements can comprise other forms of semiconductor layers which include active or operable portions of semiconductor devices.

In the preferred embodiment, the pad oxide layer 102 comprises silicon dioxide, which is often referred to as "silicon oxide," or even more simply "oxide." The pad oxide 102 preferably has a thickness of approximately 20 Å to 300 Å. This oxide layer provides a stress relieving buffer between the silicon substrate and an overlying layer of masking material.

Figure 1B:
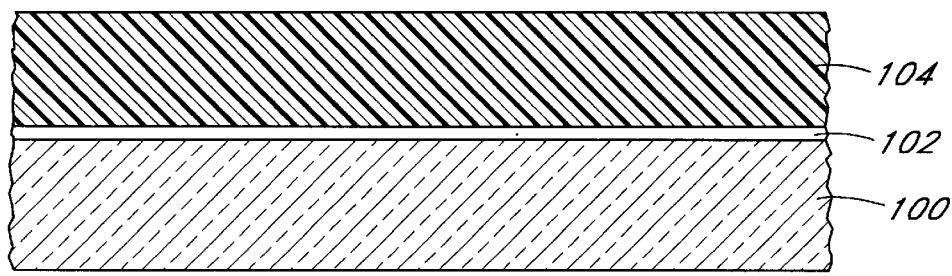
FIG. 1B is a cross-sectional view of the substrate of FIG. 1A, wherein a layer of silicon nitride has been deposited on the top of the pad oxide layer.

FIG. 1B illustrates that, subsequent to the growth of the pad oxide layer 102, a layer of masking material 104 is formed on the pad oxide layer 102. In the illustrated embodiment, the layer of masking material 104 comprises a layer of silicon nitride, preferably having a thickness of about 500 Å to 3,000 Å.

Figure 1C:
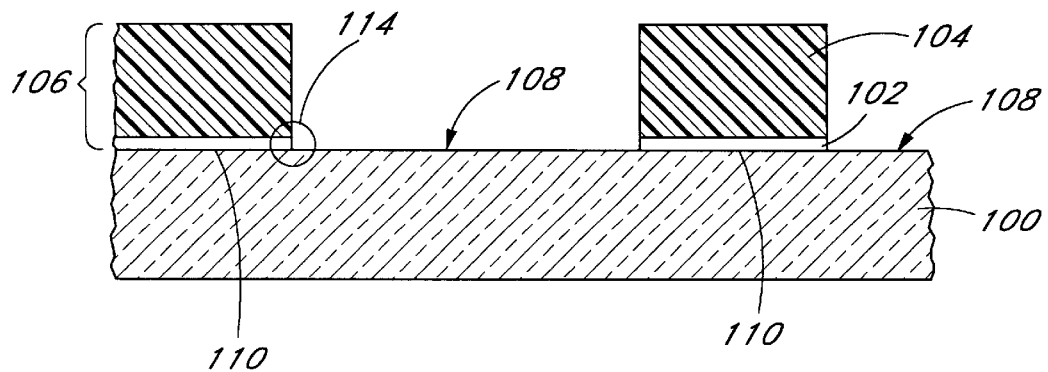
FIG. 1C is a cross-sectional view of the substrate of FIG. 1B, wherein the nitride masking stack has been patterned and etched to expose isolation regions of the substrate.

As illustrated in FIG. 1C, the masking material 104 has been patterned and etched, in accordance with conventional photolithographic principles. The patterning and etching of the masking material 104 results in the formation of a plurality of masking stacks 106 on the substrate 100, while exposing a plurality of isolation regions 108 on the substrate 100, where field oxide will be subsequently formed. The stacks 110 cover regions in which transistor active areas 110 will be formed. As is well known in the art, the silicon nitride layer 104 within the stacks 106 serves as an oxidant diffusion barrier, preventing oxidation of the active areas 110 during the growth of field oxide within the isolation regions 108. In conventional oxidation processes, as noted in the background section, the region beneath a gate corner 114 is subject to high stress which can induce defects in the circuit under fabrication.

Figure 2A:
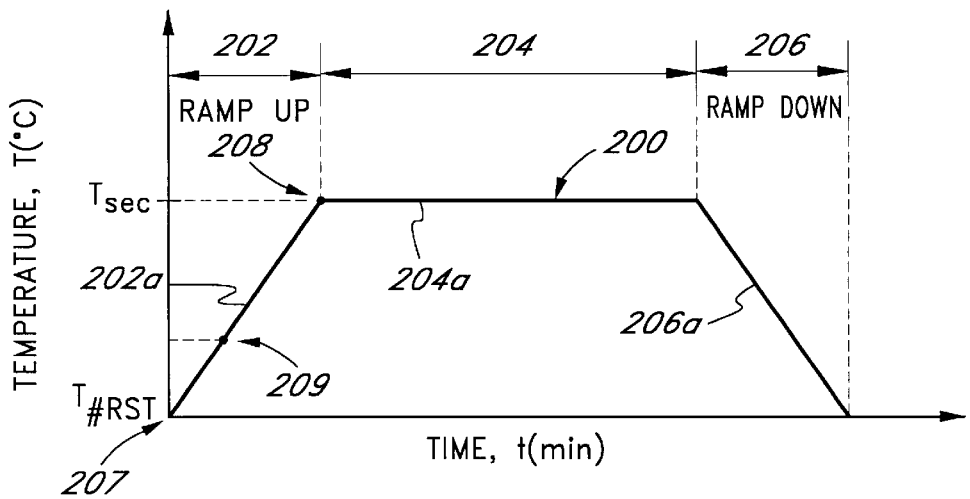
FIG. 2A is a graphical representation of oxidation temperature versus oxidation time, showing the substrate temperature change during the preferred oxidation process.
Figure 2B:
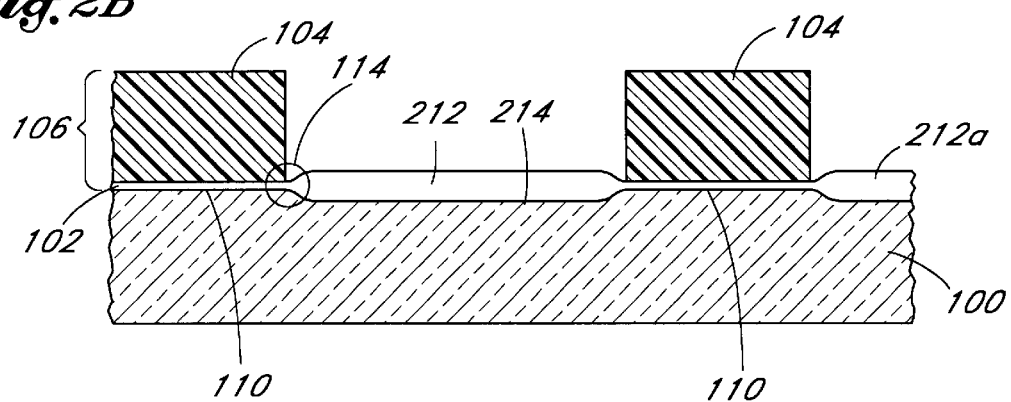
FIG. 2B is a partial cross-sectional view of the substrate of FIG. 1C, wherein an initial oxide has been grown in the isolation regions.
Figure 2C:
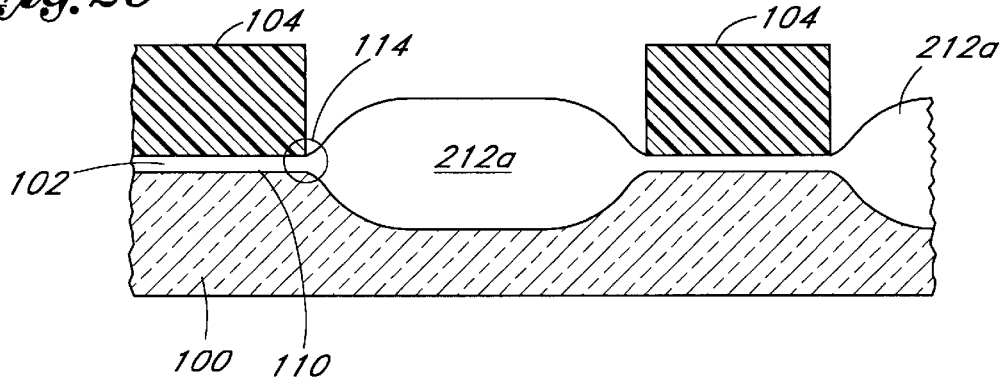
FIG. 2C is a cross-sectional view of the substrate of FIG. 2B, wherein the field oxide structures have been further grown in accordance with the preferred process.

As illustrated in FIG. 2A–2C, following the definition of the isolation regions 108 and active areas 110, a plurality of field oxide elements are then grown in the exposed regions 108, in accordance with the preferred embodiment.

Turning to FIG. 2A, the process steps of the preferred embodiment illustrated by reference a time-temperature curve 200. The time-temperature curve 200 demonstrates the substrate temperature during the oxidation process, and hence represents the preferred oxidation process. As shown in FIG. 2B, the oxidation process includes three distinct periods, namely a first period 202, a second period 204 and a third period 206, characterized by temperature-time curve segments 202a, 204a and 206a, respectively.

The first period 202 is characterized by the first portion 202a of the curve 200 and will be referred to as the ramp-up period 202 hereinbelow. As shown, during the ramp-up period 202, a substrate loaded into a reaction chamber is heated from a first temperature 207 to a higher second temperature 208. In the illustrated embodiment, the temperature increases linearly with respect to time during the ramp-up 202.

The ramp-up 202 is followed by the second or plateau period 204, characterized by the second segment 204a of the curve 200. The plateau period 204 represents a steady state in which the temperature remains constant at the second temperature 208 with time.

The third period 206, characterized by the third segment 206a of the curve 200, can be referred to as the ramp-down period 206. During this period 206, the furnace temperature decreases from the second temperature to a third temperature. In the illustrated embodiment, the third temperature is equal to the first temperature and the temperature ramps down linearly with time, as indicated by the third segment 206a.

While the illustrated temperature ramps 202a, 206a are both linear, the skilled artisan will recognize that the temperature can be changed in a non-linear fashion during the ramp up and ramp-down periods 202, 206. As is known in the art, temperature controllers can be "tuned" or programmed to minimize the time to reach the desired higher or lower temperature without overshooting the target temperature.

As will be explained more fully hereinbelow, in the preferred embodiment, a wet oxidation process begins during the ramp-up period 202, and thus begins at a temperature below the steady state temperature 208. The oxidation -rate through a growing oxide layer strongly depends on the oxidation temperature and the thickness of the growing oxide layer. Since the oxidation of silicon is a heat driven process, the oxide growth rate is slow at lower temperatures. However, increasing oxidation temperature significantly increase the oxidation rate, especially at the beginning of the oxidation when the oxide layer is thin. Ordinarily, wet oxidation upon clean wafers, particularly at high temperatures, results in rapid volumetric expansion which exerts significant stress within the substrate. The stress, in turn, induces defects within the substrate under the edge of the nitride masking stack.

Typically, oxidation has been suppressed until a steady state temperature has been achieved, in order to avoid such defects. The steady state temperature at which oxidation is conducted is generally selected to be low enough to reduce the density of stress-induced defects to a tolerable level.

In accordance with the preferred embodiment, however, oxidation can be performed during the ramp-up period 202, as well as during the plateau period 204, without inducing excessive defects. In the illustrated embodiment, a relatively low initial oxidation rate is provided, significantly slowing down the growth and resultant volumetric expansion. This, in turn, provides sufficient time to grow an initial oxide with a thickness sufficient to place further oxidation through the initial oxide in the logarithmic regime. This further oxidation is thus in relative equilibrium with the oxide viscosity, such that volumetric expansion does not exert significant stress on the substrate under the edge of the nitride masking stack. As will be understood from the foregoing explanation, a relative equilibrium state exists between the oxidation rate and the oxide viscosity at this lower temperature range. This equilibrium condition is most preferably maintained as oxidation is continued at higher temperatures.

In the preferred embodiment, the equilibrium between the oxidation rate and the oxide viscosity is advantageously established during the ramp up period 202. As illustrated in FIG. 2B, a thin layer 212 of oxide first grows without exerting undue stress to the substrate regions under the edge of the nitride masking stack 106. In order to grow the oxide layer to a desired final thickness, however, this equilibrium state is carefully extended into higher temperature ranges, and hence into higher oxidation rates. Accordingly, process parameters, including process temperature, time, oxidizing gas flow, and gas pressure, should be strictly controlled. The relative equilibrium between the oxidation rate and the viscosity can be maintained using an oxidation furnace system which precisely controls these parameters as the oxide layer grows. Such precise control is facilitated by an advanced microprocessor temperature controller. The reaction chamber in an exemplary implementation of the invention is a vertical diffusion furnace, available under the trade name ASM 400 from ASM America, Inc., of Phoenix, Ariz. The temperature controller of the furnace enables precise, repeatable control of process parameters.

Furthermore, the furnace should uniformly control the parameters throughout the furnace. This is especially important where each wafer in a batch is exposed to a variety of fluctuating parameters.

In accordance with the preferred embodiment of the invention, a first step of the oxidation process includes growth of an initial oxide 212 layer during the ramp-up period 202. This initial field oxide growth is conducted at a restricted rate. This initial field oxide growth, during the linear stage, may be restricted by one of several means. In the preferred embodiment, the growth rate during this initial period is firstly restricted by starting oxidation at a relatively low temperature, particularly between about 500° C. and 800° C., more preferably between about 650° C. and 750° C., and most preferably about 700° C. Once the furnace has reached the desired initial oxidation temperature, a batch of semiconductor wafers may be introduced into the furnace.

Growth rate is preferably further restricted by use of a relatively slow oxidizing agent at this stage. In the illustrated embodiment the oxidizing agent during the initial period comprises substantially pure oxygen gas, or dry oxygen ($O_2$). Accordingly, the rate of oxidation during this initial period is slow relative to wet oxidation.

As the initial oxide layer 212 continues to grow, the temperature within the furnace is ramped up to an intermediate temperature 209, preferably between about 800° C. and 850° C. Accordingly, during the initial ramp-up, diffusion through the ever-increasing thickness of the oxide layer 212 is aided by the increasing temperature. By the time 800° C. is approached, wet (pyrogenic) oxidation can be started. Accordingly, at that point, hydrogen gas may be injected into the furnace to create water steam by a pyrogenic technique which reacts $H_2$ and $O_2$ to form water vapor and $OH^-$ radicals (species). A wet oxidation may thereby proceed at a faster rate.

The temperature preferably continues to ramp up during the wet oxidation to the second or plateau temperature 208. Preferably, the plateau temperature 208 ranges from about 850° C. to 1,150° C., more preferably between about 900° C. and 1,100° C., and most preferably about 1,000° C. The ratio of flow rates of the oxygen gas to the hydrogen gas ($O_2:H_2$) should range from about 1:1 to about 5:1. It will be understood by one of skill in the art, however, that the parameters may vary in accordance with the number of wafers in a batch, the size of a furnace, and the desired oxidation process.

In the preferred embodiment, the oxide layer 212 grows as the temperature of the furnace ramps up. As previously mentioned, after an initial oxide growth, further growth occurs while a relative equilibrium between the oxidation rate and the oxide viscosity is maintained through controlling the furnace parameters. Controlled ramp-up speed of the furnace provides the required heat and the time to maintain this relative equilibrium. At this point, an expected increase in oxidation rate by increasing temperature is balanced out by the increasing thickness of the oxide layer which slows the diffusion transport of oxidizing species towards silicon/silicon dioxide interface 214. In the preferred embodiment, a ramp-up speed preferably ranges between about 1° C./minute and 15° C./minute, more preferably between about 5° C./minute and 10° C./minute. The ratio of $O_2:H_2$ is preferably maintained at about 1:1 during ramping.

At the second temperature 208 (FIG. 2A) the ramping-up is halted and the oxidation is proceeded in this non-varying temperature range represented by the plateau 204a. As previously mentioned, this temperature 208 is most preferably within the range of 950° C. to 1,100° C., which is also an optimum oxidation temperature for silicon. At this temperature 208, despite the increase in temperature. the equilibrium between the viscosity and the oxidation rate is preserved. As illustrated in FIG. 2C, at the end of constant temperature oxidation step, the oxide layer 212 is grown to desired thickness with a minimal defect formations. In the preferred embodiment, this period may extend for between about 30 minutes and 300 minutes so that a field oxide reaches to a thickness range between about 2,000 Å and 7,000 Å. Once the final thickness is reached, the oxidizing ambients can be turned off and an inert ambient is turned on. The furnace temperature can then be ramped down at any desirable rate.

It will be understood, therefore, that the foregoing process employs a reduced initial oxidation rate relative to the initial oxidation rate in a conventional process, which is started at the plateau temperature. In the preferred embodiment, the initial oxidation rate is retarded by (1) growing an initial oxide through which wet oxidants must diffuse when wet oxidation is started; and (2) starting wet oxidation at a lower temperature than conventionally started. The oxidizing gas pressure is constant at one atmospheric pressure. The skilled artisan will readily appreciate that, in other arrangements, the oxidation rate can also be controlled by changing the oxidation pressure. Similarly, the skilled artisan will recognize that other oxidation conditions can be controlled independently of the substrate temperature to switch from a slow oxidation, until such time as an adequately thick initial oxide is formed and the temperature is such as to provide adequate oxide viscosity, to a faster oxidation process Desirably, the reduction in initial rate of oxidation is selected to compensate for reduced oxide viscosity at the point oxidation, and particularly wet oxidation, is started. In other words, the rate of oxide growth is selected such that the viscosity of the growing oxide allows oxide flow to relieve the stress of oxide growth. Whether such compensation is achieved can be measured by the density of stress-induced defects, and conditions chosen through routine experimentation in accordance with the teachings herein.

Hence, although the foregoing description of the preferred embodiment of the present invention has shown, described and pointed out the fundamental novel features of the invention, it will be understood that various omissions, substitutions, and changes in the form of the detail of the apparatus and method as illustrated as well as the uses thereof, may be made by those skilled in the art, without departing from the spirit of the present invention. Consequently, the scope of the present invention should not be limited to the foregoing discussions, but should be defined by the appended claims.

I claim:

1. A process of forming an isolation region in a semiconductor substrate, comprising:
    providing the substrate with a defined isolation region therein;
    positioning the substrate in a reaction chamber;
    heating the substrate from a first temperature to a second temperature; and
    exposing the isolation region to a wet oxidizing ambient while heating the substrate from the first temperature to the second temperature, thereby growing an oxide within the isolation region while heating the substrate.

2. The process of claim 1, further comprising exposing the isolation region to the wet oxidizing ambient while maintaining the substrate at about the second temperature, thereby growing the oxide at a plateau oxidation rate.

3. The process of claim 2, wherein exposing the isolation region to the wet oxidizing ambient while heating the substrate comprises growing the oxide at a first oxidation rate slower than the plateau oxidation rate.

4. The process of claim 3, wherein a relative equilibrium is maintained between the oxidation rates and the oxide viscosities at different points in the process.

5. The process of claim 4, wherein the relative equilibrium minimizes stress-induced defects in said substrate relative to a process wherein oxidation begins at a plateau temperature.

6. The process of claim 1, wherein the isolation region is exposed to the wet oxidizing ambient for between about 30 and 300 minutes.

7. The process of claim 1, wherein said first temperature is between about 650° C. and 750° C.

8. The process of claim 7, wherein said second temperature is between about 950° C. and 1,100° C.

9. The process of claim 1, further comprising exposing the isolation region to a dry oxidizing ambient while heating and prior to exposing the isolation region to the wet oxidizing ambient, and wherein the wet oxidizing ambient comprises a mixture of oxygen and hydrogen.

10. The process of claim 9, wherein the dry oxidizing ambient comprises $O_2$.

11. The process of claim 9, wherein said mixture of oxygen and hydrogen is introduced at a temperature between about 800° C. and 850° C.

12. The process of claim 9, wherein said mixture of oxygen and hydrogen comprises a ratio of oxygen to hydrogen between about 1:1 and 5:1.

13. A process of forming an integrated circuit, comprising:
    defining an isolation region in a semiconductor substrate;
    ramping the temperature of the substrate from a first temperature to a second temperature within a reaction chamber; and
    introducing a wet oxidizing gas into the chamber to grow an oxide in the isolation region while ramping the temperature.

14. The process of claim 13, further comprising introducing a dry oxidizing gas into the chamber while ramping the temperature and prior to introducing the wet oxidizing gas, the dry oxidizing gas growing an initial oxide in the isolation region.

15. The process of claim 13, wherein the first temperature is between about 500° C. and 800° C. and the second temperature is between about 850° C. and 1,150° C.

16. The process of claim 13, wherein the wet oxidizing gas is introduced when the substrate temperature is between about 800° C. and 850° C.

17. The process of claim 13, further comprising growing an intitial oxide prior to introducing the wet oxidizing gas, wherein growing the initial oxide is slower than an oxide growth rate upon introducing the wet oxidizing gas.

18. The process of claim 13, further comprising continuing to provide the wet oxidizing gas into the chamber when the substrate is at the second temperature.

19. The process of claim 18, wherein continuing to provide the wet oxidizing gas is conducted for between about 30 minutes and 300 minutes.

20. A method of forming field isolation elements in a semiconductor substrate, comprising:
    masking a portion of the substrate, leaving an exposed isolation region;
    growing an initial oxide in the exposed isolation region while ramping a substrate temperature from a first temperature to a higher second temperature under a first set of oxidation conditions including at least a segment of wet oxidation; and
    after growing the initial oxide, growing a further oxide through the initial oxide while maintaining the substrate at substantially the second temperature.

21. The method of claim 20, wherein growing the initial oxide comprises a dry oxidation during a first ramping segment and a subsequent wet oxidation during a second ramping segment.

22. The method of claim 20, wherein a first range of oxidation rates while ramping the temperature is relatively lower than a second range of oxidation rates while maintaining the substrate at substantially the second temperature.

23. The method of claim 22, wherein a first range of oxide viscosities while ramping the temperature is relatively lower than a second range of oxide viscosities while maintaining the temperature at substantially the second temperature.

24. The method of claim 23, wherein a relative equilibrium is maintained between the oxidation rates and the oxide viscosities while ramping the temperature and while maintaining the substrate at substantially the second temperature.

25. The method of claim 20, wherein ramping the substrate temperature comprises increasing the temperature at a rate between about 1° C./min and 15°/min.

26. The method of claim 20, wherein ramping the substrate temperature comprises increasing the temperature at a rate between about 5° C./min and 10° C./min.

* * * * *